United States Patent
Ngo et al.

(10) Patent No.: US 7,648,886 B2
(45) Date of Patent: Jan. 19, 2010

(54) SHALLOW TRENCH ISOLATION PROCESS

(75) Inventors: Minh-Van Ngo, Fremont, CA (US); Qi Xiang, San Jose, CA (US); Paul R. Besser, Sunnyvale, CA (US); Eric N. Paton, Morgan Hill, CA (US); Ming-Ren Lin, Cupertino, CA (US)

(73) Assignee: Globalfoundries Inc., Grand Cayman (KY)

(*) Notice: Subject to any disclaimer, the term of this patent is extended or adjusted under 35 U.S.C. 154(b) by 0 days.

(21) Appl. No.: 10/341,863

(22) Filed: Jan. 14, 2003

(65) Prior Publication Data

US 2004/0137742 A1    Jul. 15, 2004

(51) Int. Cl.
H01L 21/762    (2006.01)

(52) U.S. Cl. .................. 438/431; 438/424; 438/425; 438/426; 438/430; 438/435

(58) Field of Classification Search ............. 438/285, 438/404, 424–426, 430, 435, 694, 696, 699, 438/701, 703, 723, 724, 752, 778, 787, 791, 438/933, FOR. 134, FOR. 167, FOR. 221, 438/FOR. 222, FOR. 227, FOR. 291, FOR. 292, 438/431

See application file for complete search history.

(56) References Cited

U.S. PATENT DOCUMENTS

| | | | |
|---|---|---|---|
| 5,254,873 A | 10/1993 | Poon et al. | |
| 5,266,813 A | 11/1993 | Comfort et al. | |
| 5,266,816 A | 11/1993 | Comfort et al. | |
| 5,406,111 A | 4/1995 | Sun | |
| 5,455,194 A | 10/1995 | Vasquez et al. | |
| 5,668,044 A | 9/1997 | Ohno | |
| 5,700,712 A | 12/1997 | Schwalke | |
| 5,719,085 A * | 2/1998 | Moon et al. | 438/424 |
| 5,793,090 A | 8/1998 | Gardner et al. | |
| 5,837,612 A * | 11/1998 | Ajuria et al. | 438/697 |
| 6,013,937 A | 1/2000 | Beintner et al. | |
| 6,037,238 A * | 3/2000 | Chang et al. | 438/426 |
| 6,074,930 A | 6/2000 | Cho et al. | |
| 6,074,931 A * | 6/2000 | Chang et al. | 438/424 |
| 6,080,618 A | 6/2000 | Bergner et al. | |

(Continued)

FOREIGN PATENT DOCUMENTS

EP    0 245 622 B1    11/1987

(Continued)

OTHER PUBLICATIONS

Written Opinion of the International Searching Authority; International Application No. PCT/US2004/008464; International Filing Date Mar. 11, 2004; 6 pgs.

(Continued)

*Primary Examiner*—N Drew Richards
*Assistant Examiner*—Joannie A Garcia
(74) *Attorney, Agent, or Firm*—Meyertons, Hood, Kivlin, Kowert & Goetzel, P.C.

(57) ABSTRACT

A method of manufacturing an integrated circuit (IC) utilizes a shallow trench isolation (STI) technique. The shallow trench isolation technique is used in strained silicon (SMOS) process. The liner for the trench is formed to in a low temperature process which reduces germanium outgassing. The low temperature process can be a UVO, ALD, CVD, PECVD, or HDP process.

25 Claims, 8 Drawing Sheets

U.S. PATENT DOCUMENTS

| | | | |
|---|---|---|---|
| 6,080,627 A * | 6/2000 | Fan et al. | 438/270 |
| 6,080,637 A * | 6/2000 | Huang et al. | 438/424 |
| 6,087,705 A * | 7/2000 | Gardner et al. | 257/510 |
| 6,107,143 A | 8/2000 | Park et al. | |
| 6,136,664 A | 10/2000 | Economikos et al. | |
| 6,146,970 A * | 11/2000 | Witek et al. | 438/424 |
| 6,150,212 A | 11/2000 | Divakaruni et al. | |
| 6,168,961 B1 | 1/2001 | Vaccari | 438/16 |
| 6,207,531 B1 * | 3/2001 | Pen-Liang | 438/424 |
| 6,214,696 B1 | 4/2001 | Wu | |
| 6,271,143 B1 | 8/2001 | Mendicino | |
| 6,306,722 B1 | 10/2001 | Yang et al. | |
| 6,335,293 B1 | 1/2002 | Luo et al. | |
| 6,391,731 B1 | 5/2002 | Chong et al. | |
| 6,399,512 B1 * | 6/2002 | Blosse et al. | 438/723 |
| 6,414,364 B2 | 7/2002 | Lane et al. | |
| 6,426,278 B1 | 7/2002 | Nowak et al. | |
| 6,456,370 B1 | 9/2002 | Ingles, Jr. | |
| 6,468,853 B1 | 10/2002 | Balasubramanian et al. | |
| 6,498,383 B2 * | 12/2002 | Beyer et al. | 257/510 |
| 6,524,931 B1 | 2/2003 | Perera | |
| 6,548,261 B1 | 4/2003 | Smith et al. | |
| 6,548,361 B1 | 4/2003 | En et al. | |
| 6,566,228 B1 | 5/2003 | Beintner et al. | |
| 6,613,646 B1 * | 9/2003 | Sahota et al. | 438/424 |
| 6,646,322 B2 | 11/2003 | Fitzgerald | |
| 6,656,749 B1 | 12/2003 | Paton et al. | |
| 6,673,696 B1 | 1/2004 | Arasnia et al. | |
| 6,706,581 B1 | 3/2004 | Bou et al. | |
| 7,029,988 B2 | 4/2006 | Ohnishi et al. | |
| 2002/0045312 A1 | 4/2002 | Zheng et al. | |
| 2002/0098689 A1 | 7/2002 | Chong et al. | |
| 2003/0049893 A1 | 3/2003 | Currie et al. | |
| 2003/0139051 A1 * | 7/2003 | Andideh et al. | 438/692 |
| 2004/0018307 A1 * | 1/2004 | Park et al. | 427/255.36 |
| 2004/0038529 A1 * | 2/2004 | Soininen et al. | 438/685 |
| 2004/0061161 A1 * | 4/2004 | Radens et al. | 257/301 |
| 2004/0089914 A1 * | 5/2004 | Mouli et al. | 257/510 |
| 2005/0063451 A1 * | 3/2005 | Abe et al. | 374/121 |

FOREIGN PATENT DOCUMENTS

| | | |
|---|---|---|
| GB | 2 254 731 A | 10/1992 |
| WO | WO 02/095818 A1 | 11/2002 |
| WO | WO 02/101818 A2 | 12/2002 |

OTHER PUBLICATIONS

International Search Report; International Application No. PCT/US2004/007464; mailed Jan. 9, 2004; 3 pgs.

Ohkubo, Satoshi; Tamura Yasuyuki; Sugino, Rinji; Nakanishi, Toshiro; Sugita, Yoshihiro; Awaji, Naoki and Takasaki, Kanetake; "High Quality Ultra-Thin (4nm) Gate Oxide by UV/$O_3$ Surface Pre-Treatment of Native Oxide"; 1995 Symposium On VLSI Technology; Digest of Technical Papers; Jun. 6-8, 1995; Kyoto, Japan; 3 pgs.

Written Opinion of the International Searching Authority; International Application No. PCT/US2004/00982; International Filing Date Jan. 13, 2004; 6 pgs.

Notification of Transmittal of The International Preliminary Report on Patentability; International Application No. PCT/US2004/000982; International Filing Date Jan. 13, 2004; 10 pages.

Vossen, John L. et al., editors, Thin Film Processes II, 1991, 3 pages, Academic Press, Inc., Boston.

First Office Action for Chinese Application No. 200480002180.1; 4 pages.

Second Office Action for Chinese Application No. 200480002180.1; 4 pages.

Examination Report for EP Application No. 04 701 854.4-1235; 4 pages.

Ghandhi, Sorab K. "VSLI Fabrication Principles"; John Wiley and Sons; 1983; pp. 422-423.

Rim, K., Weiser, J., Hoyt, J.L., and Gibbons, J.F., "Enhanced Hole Mobilities in Surface-channel Strained-Si p-MOSFETs", 1995 International Electron Devices Meeting Technical Digest, 5 pages.

Van Zant, Peter, Microchip Fabrication, Mcgraw Hill 1977, pp. 31 and 39.

Weiser, J., Hoyt, J.L., Takagi, S. And Gibbons, J.F., "Strain Dependence of the Performance Enhancment in Strained-Si n-MOSFETs", 1994 International Electron Devices Meeting Technical Digest, San Francisco, CA Dec. 11-14, 1994, 5 pages.

Wolf, Stanley, Ph.D. and Tauber, Richard N., Ph.D.; "Silicon Processing for the VLSI Era"; vol. 1: Process Technology; Lattice Press; 1986; pp. 57-58, 194.

Stanley Wolf Silicon Processing for the VSLI ERA vol. 2 Lattice Press 1990 pp. 26-27.

Stanley Wolf Silicon Processing for the VSLI ERA vol. 4 Lattice Press 2002 pages170-172.

* cited by examiner

SHALLOW TRENCH ISOLATION PROCESS

CROSS-REFERENCE TO RELATED PATENT APPLICATIONS

The present application is related to U.S. application Ser. No. 10/389,456 filed on Mar. 14, 2003 by Wang et al., U.S. application Ser. No. 10/358,966 filed on Feb. 5, 2003, Nog et al., and U.S. application Ser. No. 10/341,848 filed on Jan. 14, 2003 by Arasnia et al.

FIELD OF THE INVENTION

The present invention is related to integrated circuit (IC) devices and to processes of making IC devices. More particularly, the present invention relates to a method of forming trench isolation structures on substrates or layers including germanium.

BACKGROUND OF THE INVENTION

Integrated circuits (ICs) include a multitude of transistors formed on a semiconductor substrate. Various methods of forming transistors on a semiconductor substrate are known in the art. Generally, transistors are isolated from each other by insulating or isolation structures.

One method of forming transistors on a silicon substrate involves the well-known Local Oxidation of Silicon (LOCOS) process. A conventional LOCOS process typically includes the following simplified steps. First, a silicon nitride layer is thermally grown on the silicon substrate. Generally, conventional LOCOS processes require a high quality, thermally grown silicon nitride layer to avoid delamination and other processing problems. Next, using a lithography and etch process, the nitride layer is selectively removed to produce a pattern where transistor source/drain areas are to be located. After patterning the source/drain areas, a field oxide is grown. As oxide growth is inhibited where the nitride layer still remains, the oxide only grows on the silicon substrate exposed during the source/drain patterning step. Finally, after oxide growth is complete, the remaining portions of the nitride layer are removed, leaving only the oxidized source/drain areas on the exposed silicon substrate.

Another process for forming insulating structures and defining source and drain regions is a shallow trench isolation (STI) process. A conventional STI process typically includes the following simplified steps. First, a silicon nitride layer is thermally grown or deposited onto the silicon substrate. Next, using a lithography and etch process, the silicon nitride layer is selectively removed to produce a pattern where transistor source/drain areas are to be located. After patterning the source/drain areas, the substrate is etched to form trenches. After the trenches are formed, a liner is thermally grown on the exposed surfaces of the trench. The liner oxide is typically formed at a very high temperature in a hydrochloric (HCl) acid ambient. An insulative material, such as, silicon dioxide ($SiO_2$), is blanket deposited over the nitride layer and the liner oxide within the trench. The insulative material is polished to create a planar surface. The nitride layer is subsequently removed to leave the oxide structures within the trenches.

Shallow trench isolation (STI) structures are utilized in strained silicon (SMOS) processes. SMOS processes are utilized to increase transistor (MOSFET) performance by increasing the carrier mobility of silicon, thereby reducing resistance and power consumption and increasing drive current, frequency response and operating speed. Strained silicon is typically formed by growing a layer of silicon on a silicon germanium substrate or layer.

The silicon germanium lattice associated with the silicon germanium substrate is generally more widely spaced than a pure silicon lattice, with spacing becoming wider with a higher percentage of germanium. Because the silicon lattice aligns with the larger silicon germanium lattice, a tensile strain is created in the silicon layer. The silicon atoms are essentially pulled apart from one another.

Relaxed silicon has a conductive band that contains six equal valence bands. The application of tensile strain to the silicon causes four of the valence bands to increase in energy and two of the valence bands to decrease in energy. As a result of quantum effects, electrons effectively weigh 30 percent less when passing through the lower energy bands. Thus, the lower energy bands offer less resistance to electron flow. In addition, electrons meet with less vibrational energy from the nucleus of the silicon atom, which causes them to scatter at a rate of 500 to 1000 times less than in relaxed silicon. As a result, carrier mobility is dramatically increased in strained silicon compared to relaxed silicon, providing an increase in mobility of 80% or more for electrons and 20% or more for holes. The increase in mobility has been found to persist for current fields up to 1.5 megavolts/centimeter. These factors are believed to enable a device speed increase of 35% without further reduction of device size, or a 25% reduction in power consumption without a reduction in performance.

The use of germanium in SMOS processes can cause germanium contamination problems for IC structures, layers, and equipment. In particular, germanium outgassing or out-diffusion can contaminate various components associated with the fabrication equipment and integrated circuit structures associating with the processed wafer. Further, germanium outgassing can negatively impact the formation of thin films. In addition, germanium outdiffusion can cause germanium accumulation or "pile-up" at the interface of the liner, thereby causing reliability issues for the STI structure.

Germanium outgassing can be particularly problematic at the very high temperatures and HCl ambient environments associated with the liner of a shallow trench isolation (STI) structure. For example, conventional STI liner oxide processes can utilize temperatures of approximately 1000° C. which enhance germanium outgassing.

Thus, there is a need for an STI liner which can be formed in a low temperature process. Further still, there is a need for a process of forming high quality oxides with good compatibility and yet are not susceptible to germanium outgassing. Further still, there is a need for an SMOS trench liner formation process. Yet further, there is a need for a liner formation process that is not as susceptible to germanium outgassing. Further still, there is a need for an STI process that does not utilize high temperature to thermally grow liners.

SUMMARY OF THE INVENTION

An exemplary embodiment relates to a method of manufacturing an integrated circuit. The integrated circuit includes trench isolation regions in a substrate including germanium. The method includes forming a silicon nitride layer above the substrate, and selectively etching the silicon nitride layer to form apertures associated with locations of the trench isolation (STI) regions. The method also includes forming trenches in the substrate at the locations, and forming oxide liners in the trenches of the substrate in a low temperature process.

Yet another exemplary embodiment relates to a method of forming shallow trench isolation regions in a semiconductor layer. The method includes providing a hard mask layer above the semiconductor layer, providing a photoresist layer above the hard mask layer, and selectively removing portions of the photoresist layer in a photolithographic process. The method further includes removing the hard mask layer at locations, forming trenches in the hard mask layer under the locations and forming a liner in the trenches in an ultra-violet light process.

Yet another exemplary embodiment relates to a method of forming a liner in a trench in a germanium containing layer. The method includes selectively etching the germanium containing layer to form the trench and providing the liner in the trench in a low temperature process.

BRIEF DESCRIPTION OF THE DRAWINGS

Exemplary embodiments will become more fully understood from the following detailed description, taken in conjunction with the accompanying drawings, wherein like reference numerals refer to like parts, and wherein.

DETAILED DESCRIPTION OF THE PREFERRED EMBODIMENTS

Figure 1:
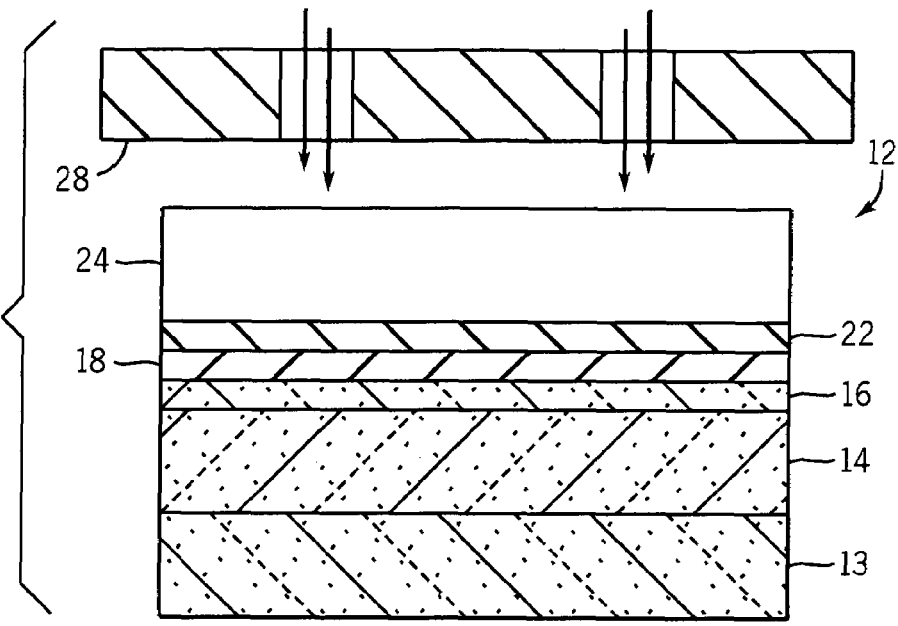
FIG. 1 is a cross-sectional view schematic drawing of a portion of a silicon germanium substrate including a strained silicon layer, an oxide layer, a hard mask layer and a photoresist layer in accordance with an exemplary embodiment of a shallow trench isolation (STI) process.

FIGS. 1 through 9 illustrate a method of manufacturing an integrated circuit (IC) in accordance with an exemplary embodiment. The method illustrated in FIGS. 1 through 9 reduces germanium outgassing and outdiffusion problems associated with silicon germanium layers or structures. The process can be used in a shallow trench isolation (STI) process or any process requiring a liner oxide and utilizing germanium or other substance prone to outgassing at high temperature. Advantageously, a liner-oxide layer can be formed at low temperature and yet provide a high quality oxide with good compatibility. For the purposes of the embodiment described with reference to FIGS. 1-9, a low temperature process refers to a process performed at a temperature of less than approximately 700° C.

Referring to FIGS. 1 through 9, a cross-sectional view of a portion 12 of an integrated circuit (IC) is illustrated. Portion 12 is subjected to process 100 (FIG. 9) to form a shallow trench isolation (STI) structure. Portion 12 includes an oxide layer 18 provided over a strained silicon layer 16. Layer 16 is provided over a semiconductor substrate 14 or a germanium-containing layer or substrate. Substrate 14 can be provided above a substrate 13.

Substrate 13 is optional and portion 12 can be provided with substrate 14 as the bottom-most layer. The embodiment described with reference to FIGS. 10-21 shows a substrate 114 without a substrate, such as, substrate 13 (FIG. 1) beneath it. Substrate 13 can be the same material or a different material than substrate 14. In one embodiment, substrate 13 is a semiconductor substrate such as a silicon substrate upon which silicon germanium substrate 14 has been grown.

Portion 12 can be any type of semiconductor device, or portion thereof, made from any of the various semiconductor processes, such as a complementary metal oxide semiconductor (CMOS) process, a bipolar process, or another semiconductor process. Portion 12 may be an entire IC or a portion of an IC, and may include a multitude of electronic component portions.

Substrate 14 is preferably silicon germanium or another semiconductor material including germanium, and can be doped with P-type dopants or N-type dopants. Substrate 14 can be an epitaxial layer provided on a semiconductor or an insulative base, such as substrate 13. Furthermore, substrate 14 is preferably a composition of silicon germanium ($Si_{1-x}Ge_x$, where X is approximately 0.2 and is more generally in the range of 0.1-0.4). Substrate 14 can be grown or deposited.

In one embodiment, substrate 14 is grown above substrate 13 by chemical vapor deposition (CVD) using disilane ($Si_2H_6$) and germane ($GeH_4$) as source gases with a substrate temperature of approximately 650° C., a disilane partial pressure of approximately 30 mPa and a germane partial pressure of approximately 60 mPa. Growth of silicon germanium material may be initiated using these ratios, or alternatively, the partial pressure of germanium may be gradually increased beginning from a lower pressure or zero pressure to form a gradient composition. Alternatively, a silicon layer can be doped by ion implantation with germanium or other processes can be utilized to form substrate 14. Preferably, substrate 14 is grown by epitaxy to a thickness of less than approximately 5000 Å (and preferably between approximately 1500 anti-reflective and 4000 Å).

A strained silicon layer 16 is formed above substrate 14 by an epitaxial process. Preferably, layer 16 is grown by CVD at a temperature of 600° C. Layer 16 can be a pure silicon layer and have a thickness of between approximately 50 and 150 Å.

Pad oxide film or oxide layer 18 is provided on layer 16. Layer 18 is optional. Layer 18 is preferably thermally grown on top of layer 16 to a thickness of between approximately 100 and 300 Å. Layer 18 serves as a buffer layer and can be thermally grown in a conventional high temperature process by heating to approximately 1000° C. in an oxygen atmosphere. Germanium outdiffusion or outgassing are not a problem at this point due to the presence of layer 18.

A barrier or hard mask layer 22 is provided over oxide layer 18. Preferably, mask layer 22 is silicon nitride ($Si_3N_4$) provided at a thickness of between approximately 300 and 1000 Å by a deposition or thermal growth process. Preferably, mask layer 22 is provided in a CVD or growth process. A low pressure, plasma enhanced chemical vapor deposition (PECVD) process can also be utilized. A conventional thermal nitride process using a dichlorosilane ($SiH_2Cl_2$), ammonia ($NH_3$) and nitrogen ($N_2$) mixture at a high temperature (e.g., 600° C. or above) can be used. The PECVD process for depositing nitride uses silane ($SiH_4$), nitrogen ($N_2$), and ammonia ($NH_3$) with a power of between approximately 550 and 650 watts at 500° C. An ammonia ($NH_3$) silane ($SiH_4/N_2$) mixture plasma, as opposed to a $N_2/NH_3/SiCl_2H_2$ associated with conventional CVD or growth process, can be used to form mask layer 22.

Figure 2:
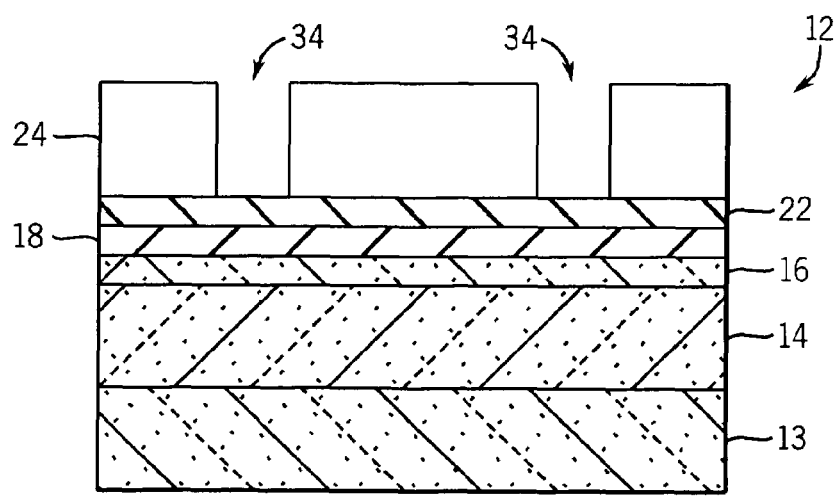
FIG. 2 is a cross-sectional view of the portion illustrated in FIG. 1, showing a lithographic patterning step.
Figure 3:
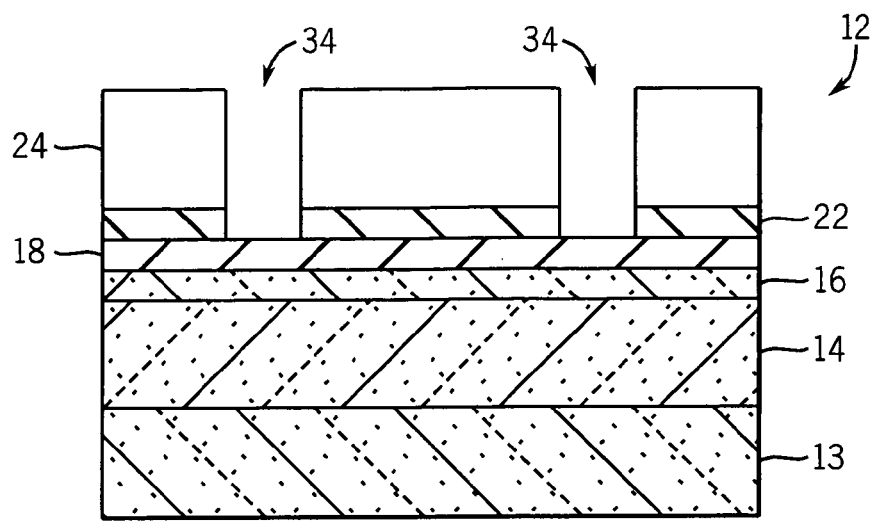
FIG. 3 is a cross-sectional view of the portion illustrated in FIG. 2, showing a selective etching step for the hard mask layer.
Figure 9:
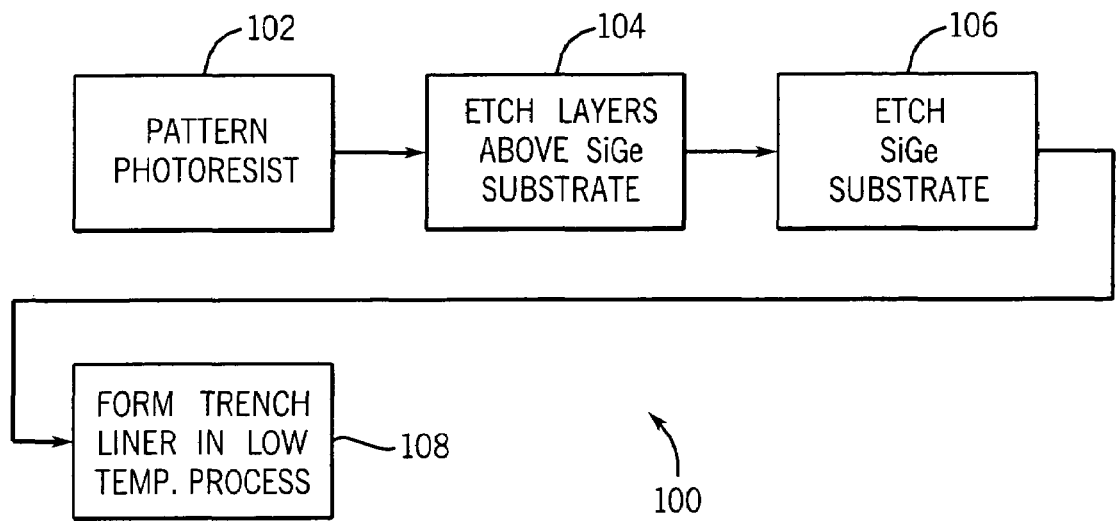
FIG. 9 is a general block diagram showing a shallow trench isolation process for the portion illustrated in FIG. 1.

A photoresist layer 24 is spun on top of mask layer 22. Preferably, photoresist layer 24 is any commercially available i-line or deep UV photoresist such as (Shipley Corp., Mass.) SPR 955 (i-line) UV5 (deep UV). In FIGS. 1 and 2, photoresist layer 24 is selectively removed via photolithographic process to leave apertures 34 in accordance with a step 102 (FIG. 9) of process 100 using a mask or reticle 28. In FIG. 3, mask layer 22 is etched via a dry-etching process so that apertures 34 reach oxide layer 18 in accordance with a step 104 of process 100 (FIG. 9). The dry-etching process is selective to silicon nitride with respect to oxide layer 24. Layer 24 can be stripped after layer 22 is etched.

Figure 4:
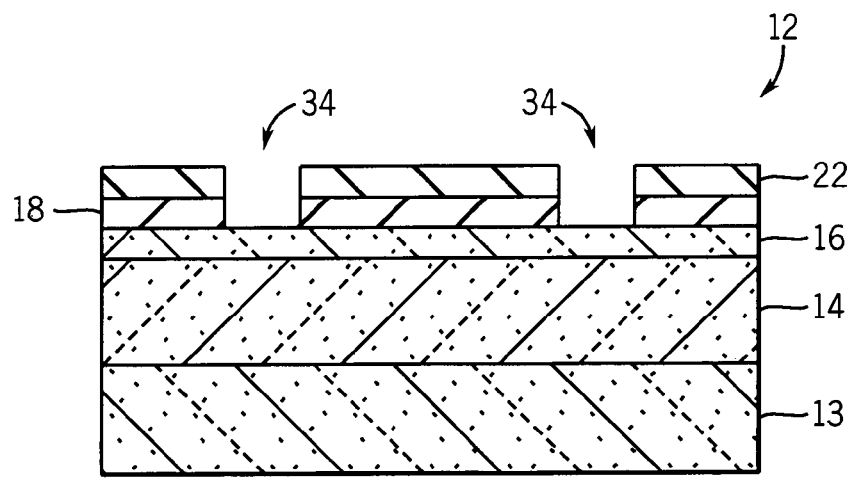
FIG. 4 is a cross-sectional view of the portion illustrated in FIG. 3, showing a selective etching step for the oxide layer.

In FIG. 4, the etch process is changed to etch through silicon dioxide material and layer 18 is etched so that apertures 34 reach layer 16 in accordance with step 104 of process 100 (FIG. 9). Layer 18 can be etched in a dry etching process. Alternatively, other etching techniques can be utilized to remove selected portions of layer 18. Photoresist layer 24 (FIG. 1) can be removed before or after oxide layer 18 is etched.

Figure 5:
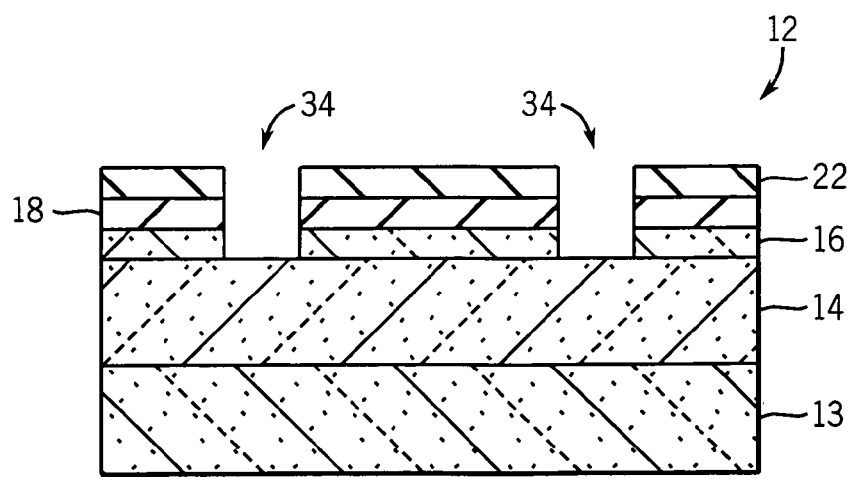
FIG. 5 is a cross-sectional view of the portion illustrated in FIG. 4, showing a selective etching step for the strained silicon layer.

In FIG. 5, the etch process is changed to etch through silicon material. Strained silicon layer 16 can be removed in accordance with a dry-etching process so that apertures 34 reach substrate 14.

Figure 6:
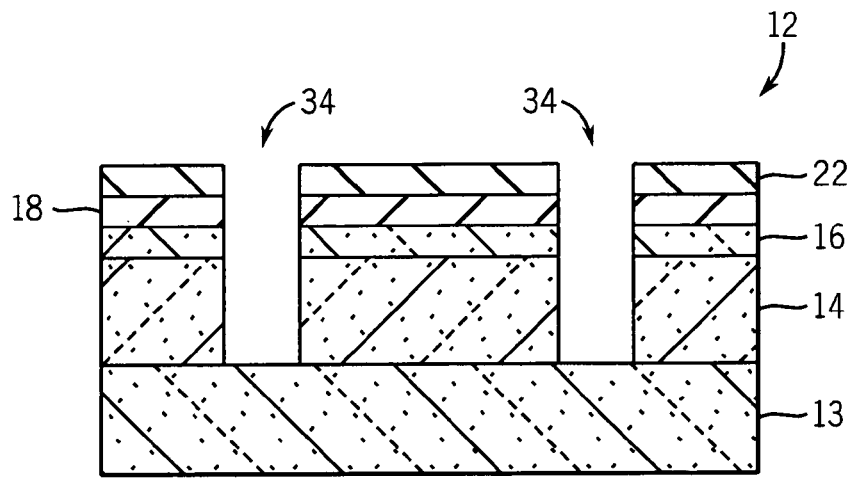
FIG. 6 is a cross-sectional view of the portion illustrated in FIG. 5, showing a selective etching step for the germanium silicon substrate.

In FIG. 6, substrate 14 is etched through apertures 34 to form trenches for shallow trench isolation structures in accordance with a step 106 of process 100 (FIG. 9). The trenches preferably have a width corresponding to that of apertures 34. The trenches preferably have a depth of between approximately 1500 and 4000 Å and a width of 0.18-1.50 nm or less. The trenches can have a trapezoidal cross-sectional shape with the narrower portion being at the bottom. The embodiment discussed with reference to FIGS. 10-21 shows trenches having a trapezoidal cross-sectional shape. Substrate 14 is preferably etched in a dry-etching process to form the trenches. Substrate 14 can be etched in the same step as layer 16.

Although described as being etched in a dry etching process, the trenches can be formed in any process suitable for providing apertures in substrate 14. In one embodiment, the apertures for the trenches are provided all the way through substrate 14 to substrate 13. Alternatively, the bottom of the trenches associated with apertures 34 may not reach substrate 13, depending upon the thickness of substrate 14. In an embodiment in which substrate 13 is not provided, substrate 14 is deeper than the trenches associated with apertures 34.

Figure 7:
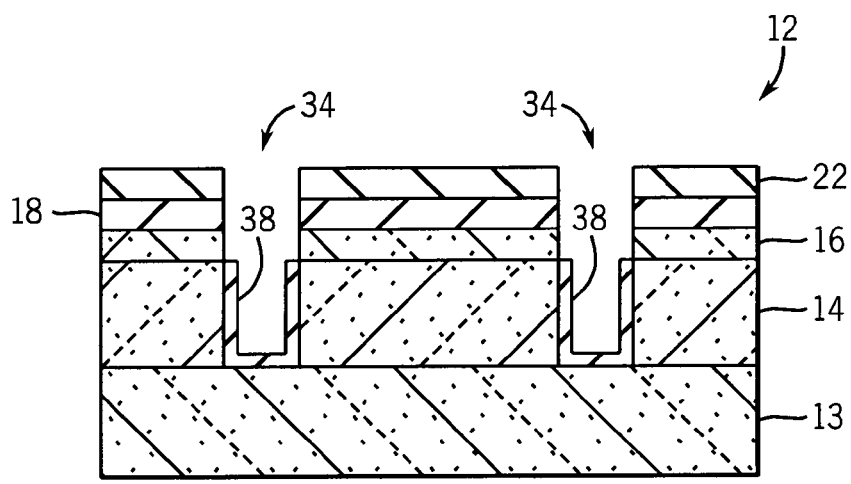
FIG. 7 is a cross-sectional view of the portion illustrated in FIG. 6, showing a low temperature liner formation step.

In FIG. 7, liners 38 are formed in the trenches associated with apertures 34. Preferably, liners 38 are oxide (e.g., silicon oxide or silicon dioxide) material formed in a low temperature process. In one embodiment, liners 38 are between approximately 200 and 500 Å thick and are provided over the bottom and side walls of the trench. In one embodiment, layers 18 and 22 are stripped before the formation of liners 38. In a preferred embodiment, layers 18 and 22 are not stripped until after the trenches are filled.

Figure 8:
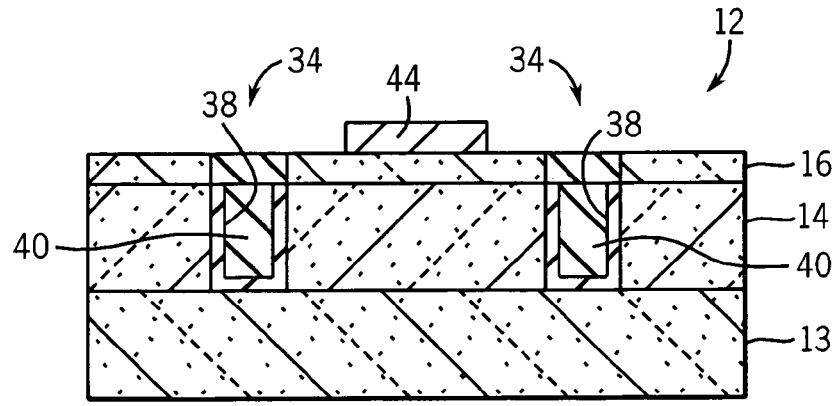
FIG. 8 is a cross-sectional view of the portion illustrated in FIG. 7, showing a gate formation step.

Liners 38 can be formed on layers 16, 18, and 22, although they are shown in FIG. 8 as being formed on substrate 14 only. The embodiment discussed with reference to FIGS. 10-21 shows liners 138 formed on layers 116, 118, and 122 and also above layer 122.

According to one embodiment, liners 38 are formed in an advantageous ultraviolet light ozone (UVO) process. In one embodiment, portion 12 including the trenches associated with apertures 34 are provided in an oxygen atmosphere and subjected to ultraviolet light. In one embodiment, the trenches upon being exposed to UV light react to form ozone ($O_3$) and atomic oxygen (O) by absorbing UV light having a wavelength of approximately 185 nm. Once formed, the ozone can undergo further decomposition to form additional atomic oxygen by absorbing UV light having a wavelength of about 254 nm.

The atomic oxygen acts as a strong oxidizing agent. Both atomic oxygen and ozone may react with the silicon associated with substrate 14 and/or layer 16 to form an oxide layer. Although liners 38 are shown only with substrate 14, liners 38 can also be grown on side walls associated with layer 16. Exemplary UVO processes are discussed in U.S. Pat. No. 6,168,961 issued to Vaccari on Jan. 2, 2001. Any technique utilizing any UVO technique can be utilized according to this embodiment including adjustments of UVO energies and oxygen environments.

Advantageously, the UVO process is a low temperature process, thereby reducing germanium outdiffusion. Preferably, the UVO process is performed at a temperature of less than approximately 600° C. Although a low temperature is utilized, high quality and good compatibility liners 38 can be produced. In a most preferred embodiment, the UVO process is performed at a temperature well below 600° C. (e.g., below 550° C.).

According to another embodiment, a dual frequency RF power PECVD process is utilized to form liners 38 at a temperature of between approximately 500 and 550° C. Preferably, the chemical vapor deposition process is performed at a low temperature (e.g., less than 700° C.) and utilizes $SiH_4$ and $O_2$ gases. After the formation of a 200-500 Å thick layer for liners 38, a quick rapid thermal anneal (RTA) using an $N_2$ ambient is performed at a temperature between approximately 900 and 1000° C. (e.g., 950° C.) for approximately 30 seconds. Applicant believes that the relatively short RTA time will not cause significant germanium outdiffusion or outgassing.

In yet another embodiment, liners 38 can be formed by an atomic layer deposition (ALD) technique. Preferably, the ALD technique utilizes a temperature of approximately 700° C. with a silane and oxygen atmosphere. According to an exemplary embodiment, a pulse cycle process is utilized for the ALD technique in which $SiH_4$ and $O_2$ gas flows are alternately turned on and off (pulsed) for between approximately 10 and 30 seconds.

In still another embodiment, liners 38 can be formed in a high density plasma oxide deposition (HDP) process similar to the CVD process discussed above. Preferably, the deposition processes do not utilize $NH_3$, instead utilizing silane at a temperature below 700° C. The HDP process preferably utilizes $SiH_4$ and $O_2$ gases and a temperature of between approximately 600 and 650° C. The HDP process utilizes high RF power (e.g., between approximately 4000 and 5000 watts).

In FIG. 8, a layer of insulative material 40 is blanket deposited over layer 16 and within the trenches associated with apertures 34. Insulative material 40 is preferably silicon dioxide deposited in a HDP process. Preferably, insulative material 40 is deposited in a silane ($SiH_4$) process. Alternatively, a boron phosphate silicon glass (BPSG) process can be utilized. Insulative material 40 is preferably between approximately 2000 and 8000 Å thick.

Insulative material 40 is removed by polishing/etching until a top surface of layer 16 is reached. The removal of insulative material 40 leaves oxide material within the trenches associated with apertures 34. Insulative material 40 can be removed by a number of stripping or etching processes. Preferably, insulative material 40 is removed from above layer 16 by chemical-mechanical polishing (CMP).

In one embodiment, insulative material 40 is deposited after the trenches are formed and before layer 22 is stripped. The insulative material is polished or etched until layer 22 is reached. Layers 22 and 18 can be stripped in a subsequent process.

Although material is shown in FIG. 8 as being a single structure formed within the trenches (above the top surface and side surfaces of liners 38) to a top surface of layer 16, insulative material 40 may stop at a top surface of liners 38.

After insulative material 40 is provided in the trenches associated with apertures 34, a gate structure 44 can be provided. Gate structure 44 can be a conventional MOSFET gate structure, such as, a metal over oxide gate structure or polysilicon over oxide gate structure. In one embodiment, gate structure 44 is comprised of a tantalum nitride or titanium nitride gate conductor formed by a plasma vapor deposition sputtering technique. During sputtering, nitrogen ($N_2$) gas can be provided to modify the metal and nitrogen composition of the gate conductor. This modification can be used to adjust a work function associated with the gate structure 44. For example, a 200 millivolt shift in threshold voltage can be achieved by adjusting the flow of nitrogen gas associated with gate structure 44.

FIGS. 10 through 21 illustrate a method of manufacturing an integrated circuit (IC) in accordance with another exemplary embodiment. The method illustrated in FIGS. 10 through 21 reduces germanium outgassing and outdiffusion problems associated with silicon germanium structures. The process can be used in a shallow trench isolation (STI) process or any process requiring a liner oxide and utilizing germanium or other substance prone to outgassing at high temperature. Advantageously, a liner oxide layer can be formed from another layer formed at low temperature and yet provides a high quality oxide with good compatibility. Low temperature for the embodiment discussed with reference to FIGS. 10-21 is a temperature below approximately 700° C. Similar structures in FIGS. 1-8 have similar reference numerals (differing by 100) to the structures illustrated in FIGS. 10-20.

Figure 21:
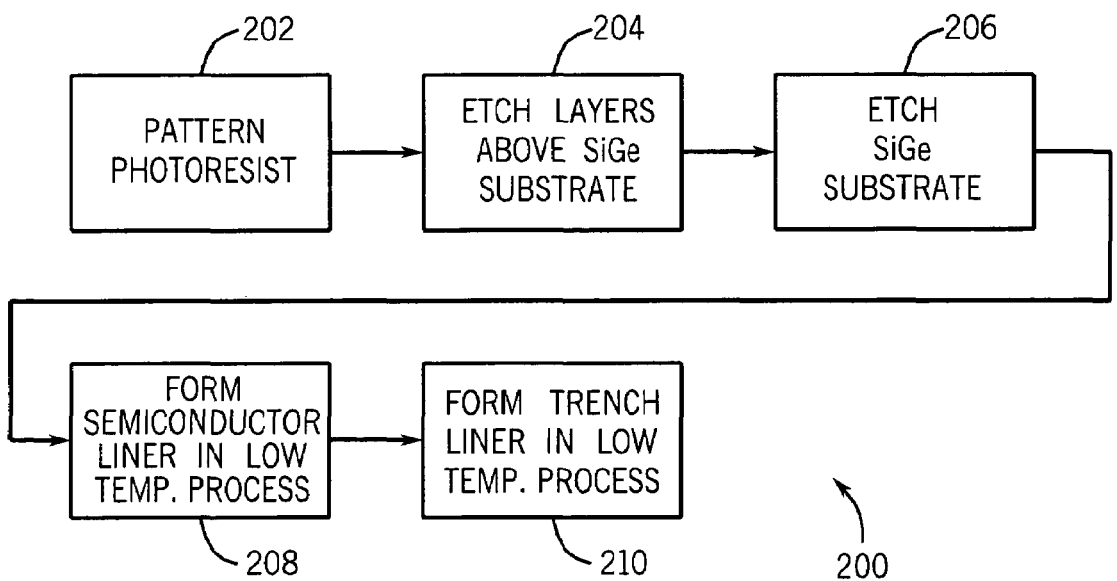
FIG. 21 is a general block diagram showing a shallow trench isolation process for the portion illustrated in FIG. 10 in accordance with another exemplary embodiment.
Figure 10:
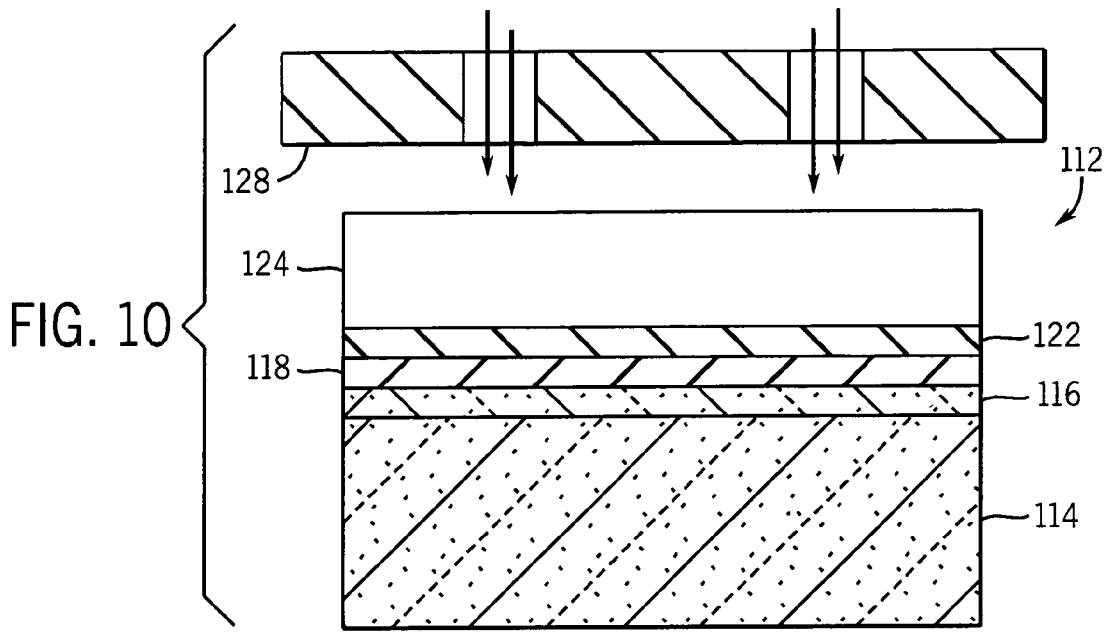
FIG. 10 is a cross-sectional view schematic drawing of a portion of a silicon germanium substrate including a strained silicon layer, an oxide layer, a hard mask layer and a photoresist layer in accordance with another exemplary embodiment of a shallow trench isolation (STI) process.

Referring to FIGS. 10 and 21, a cross-sectional view of a portion 112 of an integrated circuit (IC) is illustrated. Portion 112 (FIG. 10) is subjected to process 200 (FIG. 21) to form a shallow trench isolation (STI) structure. Portion 112 includes an oxide layer 118 provided over a strained silicon layer 116. Layer 116 is provided over a semiconductor substrate 114 or a germanium containing layer or substrate. Substrate 114 can be provided above a substrate such as substrate 13 (FIG. 1).

Portion 112 can be any type of semiconductor device, or portion thereof, made from any of the various semiconductor processes such as a complementary metal oxide semiconductor (COMs) process, bipolar process, or other semiconductor process. Portion 112 may be an entire IC or a portion of an IC including a multitude of electronic component portions.

Substrate 114 is preferably silicon germanium or another semiconductor material including germanium, and can be doped with P-type dopants or N-type dopants. Substrate 114 can be an epitaxial layer provided on a semiconductor or an insulative base, such as substrate 13. Furthermore, substrate 114 is preferably a composition of silicon germanium ($Si_{1-x}Ge_x$, where X is approximately 0.2 and is more generally in the range of 0.1-0.4). Substrate 114 can be part of a wafer and can be similar to substrate 14 (FIG. 1).

A strained silicon layer 116 is formed above layer 114 by an epitaxial process. Preferably, layer 118 is grown by CVD at a temperature of 600° C. Layer 116 can be a pure silicon layer and have a thickness of between approximately 50 and 150 Å.

Pad oxide film or oxide layer 118 is provided on layer 116. Layer 118 is optional. Layer 118 is preferably thermally grown on top of layer 118 to a thickness of approximately 100-300 Å. Layer 118 serves as a buffer layer and can be thermally grown in a conventional high temperature process by heating to 1000° C. in an oxygen atmosphere. Germanium outdiffusion and outgassing are not a problem at this point due to the presence of layer 118.

A barrier or hard mask layer 122 is provided over oxide layer 118. Preferably, mask layer 122 is silicon nitride ($Si_3N_4$) provided at a thickness of between approximately 300 and 1000 Å by a deposition or thermal growth process. Preferably, mask layer 122 is provided in a CVD or growth process and can be similar to layer 22 (FIG. 1).

Figure 11:
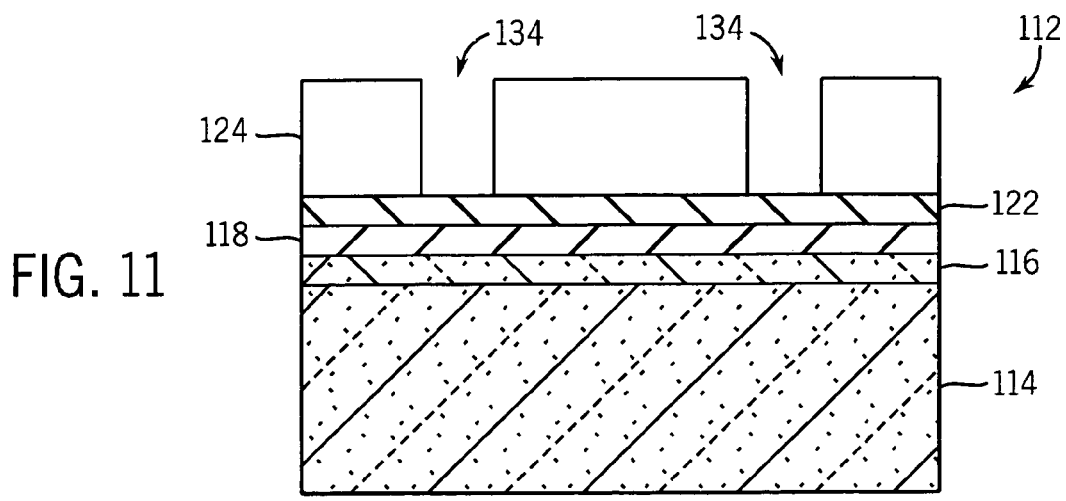
FIG. 11 is a cross-sectional view of the portion illustrated in FIG. 10, showing a lithographic patterning step.

A photoresist layer 124 is spun on top of mask layer 122. Preferably, photoresist layer 124 is any commercially available i-line or deep UV photoresist such as (Shipley Corp., Mass.) SPR 955 (i-line) UV5 (deep UV). In FIG. 11, photoresist layer 124 is selectively removed via a photolithographic process to leave apertures 134 in accordance with a step 202 (FIG. 21) of process 200 using mask or reticle 128.

Figure 12:
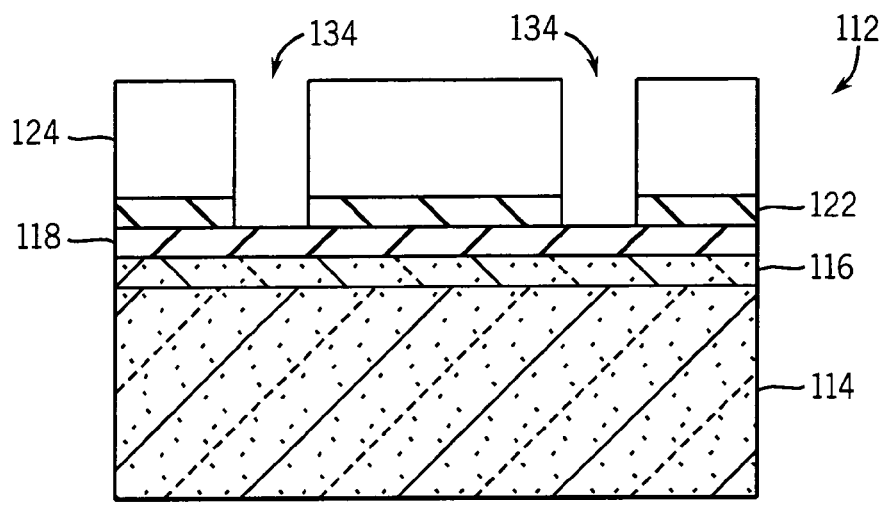
FIG. 12 is a cross-sectional view of the portion illustrated in FIG. 11, showing a selective etching step for the hard mask layer.

In FIG. 12, mask layer 122 is etched via a dry-etching process so that apertures 134 reach oxide layer 118 in accordance with a step 204 of process 200 (FIG. 21). The dry-etching process is selective to silicon nitride with respect to oxide layer 124. Layer 124 can be stripped after layer 122 is etched.

Figure 13:
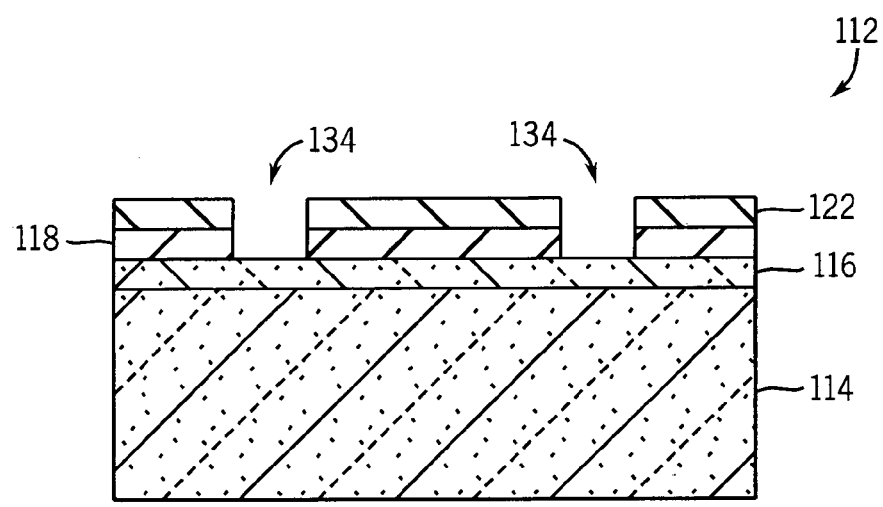
FIG. 13 is a cross-sectional view of the portion illustrated in FIG. 12, showing a selective etching step for the oxide layer.

In FIG. 13, the etch process is changed to etch through silicon dioxide material and layer 118 is etched so that apertures 134 reach layer 116 in accordance with step 204 of process 200 (FIG. 21). Layer 118 can be etched in a dry etching process. Alternatively, other etching techniques can be utilized to remove selected portions of layer 118. Photoresist layer 124 (FIG. 10) can be removed before or after oxide layer 118 is etched.

Figure 14:
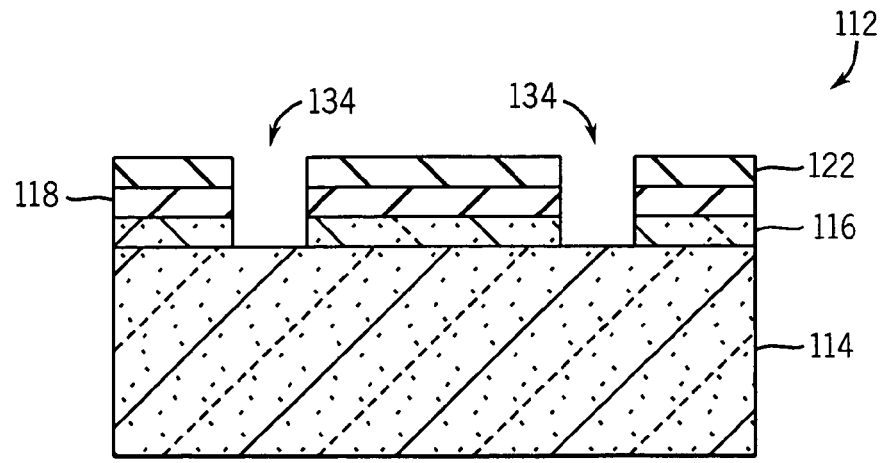
FIG. 14 is a cross-sectional view of the portion illustrated in FIG. 13, showing a selective etching step for the strained silicon layer.

In FIG. 14, the etch process is changed to etch through silicon material. Strained silicon layer 116 can be removed in accordance with a dry-etching process so that apertures 134 reach substrate 114.

Figure 15:
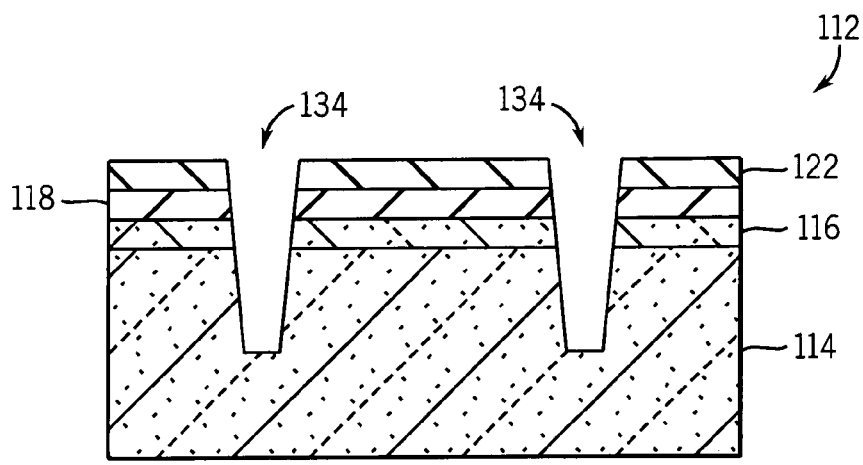
FIG. 15 is a cross-sectional view of the portion illustrated in FIG. 14, showing a selective etching step for the germanium silicon substrate.

In FIG. 15, substrate 114 is etched through apertures 134 to form trenches for a shallow trench isolation structure in accordance with a step 206 of process 200 (FIG. 21). The trenches preferably have a width corresponding to apertures 134. The trenches preferably have a depth of between approximately 1500 and 4000 Å and a width of 0.18-1.50 nm or below. The trenches can have a trapezoidal cross-sectional shape with the narrower portion being at the bottom. The trenches can also have other cross-sectional shapes. Substrate 114 is preferably etched in a dry-etching process to form the trenches. Substrate 114 can be etched in the same step as layer 116.

Although described as being etched in a dry etching process, the trenches can be formed in any process suitable for providing an aperture in substrate 114. In one embodiment, the apertures for the trenches are provided all the way through substrate 114 to another substrate (e.g., substrate 13 in FIG. 1).

Figure 16:
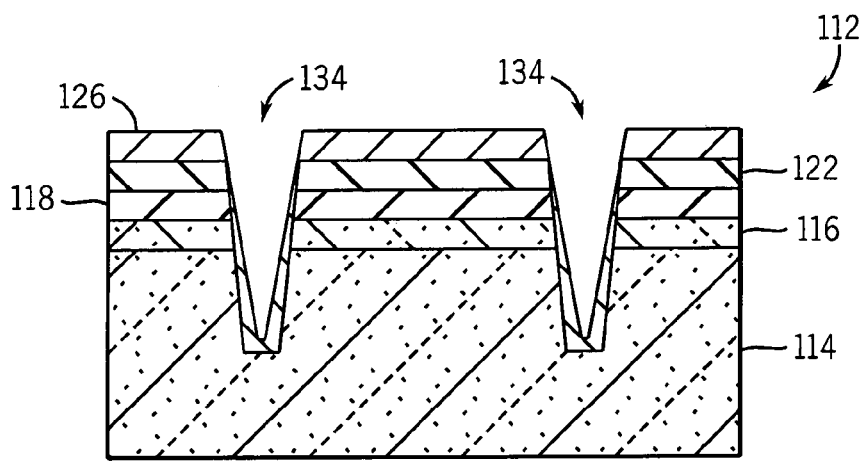
FIG. 16 is a cross-sectional view of the portion illustrated in FIG. 15, showing a semiconductor deposition step.

In FIG. 16, a conformal layer 126 is formed in the trenches and above layer 122. In one embodiment, layer 126 is a semiconductor or metal layer that can be formed at a low temperature (e.g., below 600° C.). Layer 126 is preferably a layer that can be oxidized to form an insulative material such as an oxide liner. Most preferably, layer 126 is a 100-200 Å thick amorphous silicon layer deposited by CVD at a temperature of 500-600° C. Layer 126 is deposited in accordance with step 208 of process 200 (FIG. 21).

Figure 17:
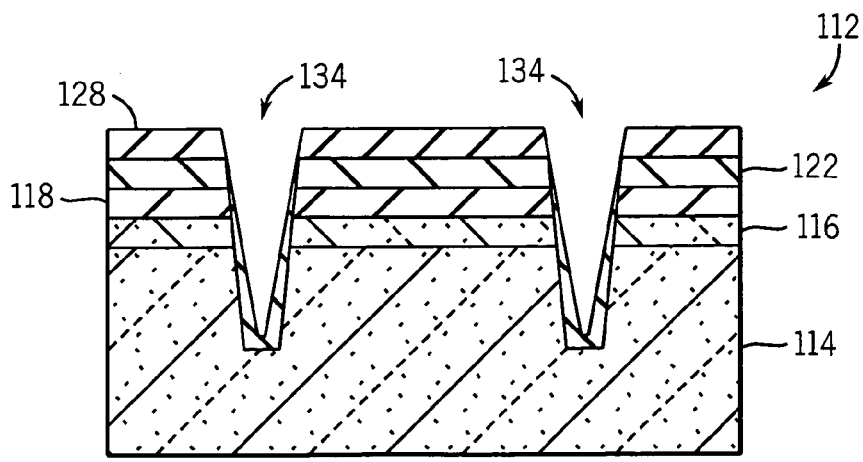
FIG. 17 is a cross-sectional view of the portion illustrated in FIG. 16, showing a liner formation step.

Layer 126 is preferably provided in sidewalls of the trenches associated with apertures 134 of substrate 114 and of layers 116, 118 and 122. Layer 126 is also provided on a top surface of layer 122. In FIG. 17, layer 126 is converted to an insulative material such as a liner oxide material 128. Preferably, layer 126 (FIG. 16) is formed into liner oxide material 128 in an oxidation process by thermally soaking $O_2$ at a temperature of between approximately 650 and 700° C. Preferably, the oxidation process can occur at a higher temperature. Germanium outdiffusion is reduced due to the barrier associated with layer 126. Preferably, the entire layer 126 is converted into liner oxide material 128.

Figure 18:
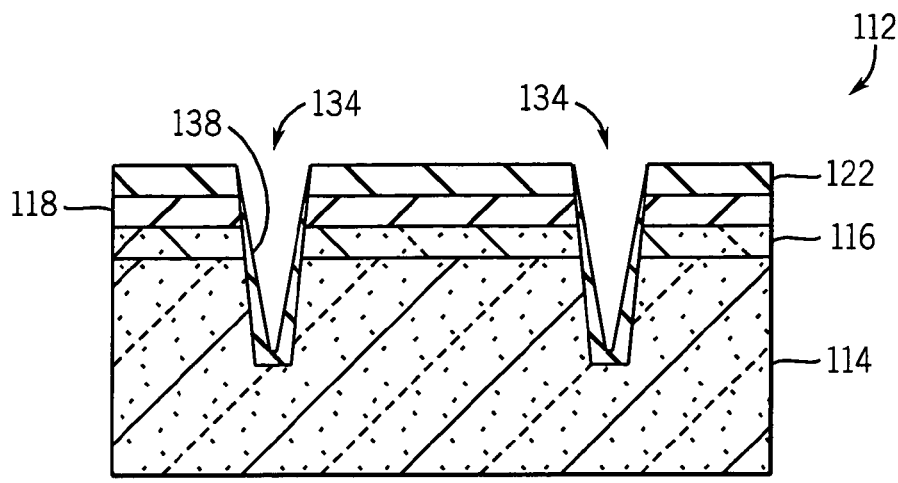
FIG. 18 is a cross-sectional view of the portion illustrated in FIG. 17, showing a selective liner removal step.

In FIG. 18, layer 122 is planarized or etched to remove liner oxide material 128 from the top surface of layer 122. Alternatively, layer 126 can be removed from top surface of layer 122 before liner oxide material 128 is formed. Liner oxide material 128 remains as liner 138 within the trenches associated with aperture 134.

In FIG. 18, liners 138 are formed in the trenches associated with apertures 134. Preferably, liners 138 are oxide (e.g., silicon oxide or silicon dioxide) material formed by oxidizing a semiconductor or metal layer. In one embodiment, liners 138 are approximately 200-500 Å thick. In one embodiment, layers 122 and 118 are stripped before the formation of liners 138. In a preferred embodiment, layers 118 and 122 are not stripped until after the trenches are filled.

Figure 19:
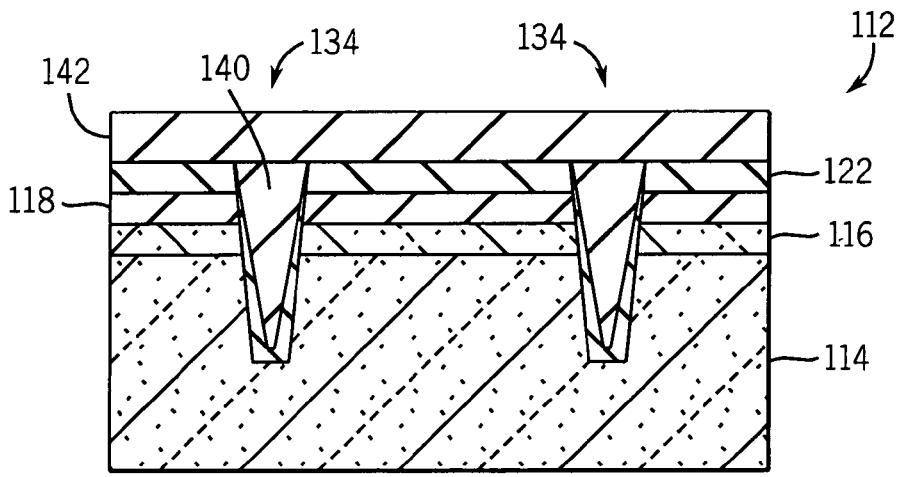
FIG. 19 is a cross-sectional view of the portion illustrated in FIG. 18, showing a trench fill step.

In FIG. 19, a layer 142 of insulative material 140 is blanket deposited over layer 116 and within trenches associated with aperture 134. Insulative material 140 is preferably silicon dioxide deposited in an HDP process and is similar to material 40 (FIG. 8). Preferably, insulative material 140 is deposited in a silane ($SiH_4$) process. Alternatively, a boron phosphate silicon glass (BPSG) process can be utilized. Insulative material 140 is preferably between approximately 2000 and 8000 Å thick.

Insulative material 140 is removed by polishing/etching until a top surface of layer 122 is reached. The removal of insulative layer leaves oxide material 140 within the trenches associated with apertures 134. Insulative material 140 can be removed by a number of stripping or etching processes. Preferably, insulative material 140 is removed from above layer 122 by dry-etching.

In one embodiment, insulative layer 142 associated with insulative material 140 is deposited after the trenches are formed and layers 122 and 116 are stripped. Insulative layer 142 is polished or etched until layer 122 is reached.

Although material is shown in FIG. 19 as being a single structure formed within the trenches (above the top surface and side surfaces of liners 138) to a top surface of layer 116, insulative material 140 may stop at a top surface of liners 138.

Figure 20:
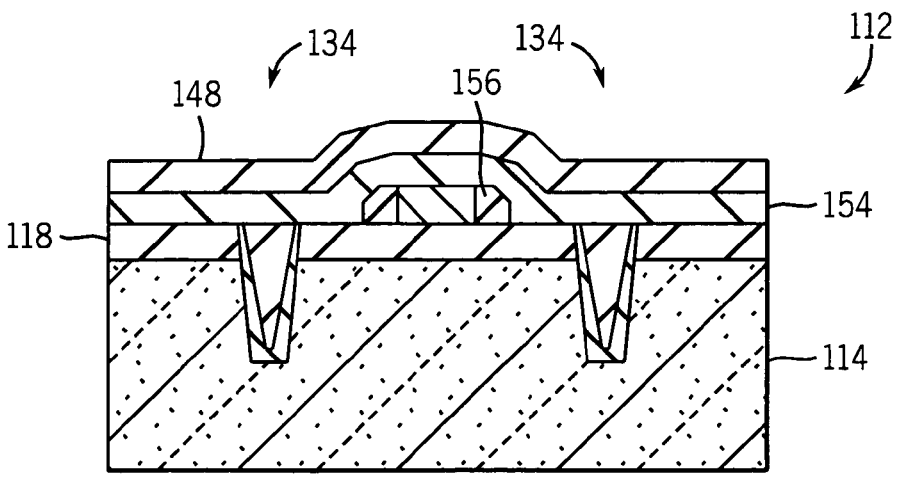
FIG. 20 is a cross-sectional view of the portion illustrated in FIG. 19, showing a gate formation step.

In FIG. 20, after insulative material 140 is provided in the trenches associated with apertures 134, a gate structure 156 can be provided. Gate structure 156 can be a conventional MOSFET gate structure, such as, a metal over oxide gate structure or polysilicon over oxide gate structure. In one embodiment, gate structure 156 is covered with an oxide (e.g., silicon dioxide layer 154) and a silicon carbide (SiC) layer 148. Portion 112 is subjected to an anneal after layers 154 and 148 are provided. Layer 148 can prevent germanium outgassing.

The technique of using layers 148 and 154 can be particularly advantageous if layer 118 is not utilized with portion 112 and gate structure 156 is provided directly over a germanium containing substrate. In another embodiment, layer 148 can be a tantalum nitride (TaN), titanium nitride (TiN), tungsten nitride (WN), titanium/titanium nitride (Ti/TiN) layer of approximately 100 Å thick and layer 154 can be a silicon dioxide layer approximately 100 Å thick. The spacers associated with gate structure 156 can be silicon nitride. According to another embodiment, process 200 can include a step to pre-clean top surface of layer 118 after gate structure 156 is formed and before layers 154 and 148 are deposited. In such an embodiment, a hydrogen ($H_2$) bake is utilized to reduce native oxide which can prevent solicidation reactions. The hydrogen bake causes less damage than argon sputtering pre-clean steps associated with conventional processes. Following cleaning and the hydrogen baking step at gas flows of approximately 800° C. to 900° C., conventional silicidation processes can be utilized. Alternatively, a hydrochloric acid (HCl) environment and low temperature anneal at 700° C. can be utilized to eliminate germanium at the surface of the semiconductor wafer.

It is understood that while the detailed drawings, specific examples, and particular values given provide a preferred exemplary embodiment of the present invention, it is for the purpose of illustration only. The shapes and sizes of trenches are not disclosed in a limiting fashion. The method and apparatus of the invention is not limited to the precise details and conditions disclosed. Various changes may be made to the details disclosed without departing from the spirit of the invention, which is defined by the following claims.

What is claimed is:

1. A method of manufacturing an integrated circuit having trench isolation regions in a substrate including germanium, the method comprising:
   forming a silicon nitride layer above the substrate;
   selectively etching the silicon nitride layer to form apertures associated with locations of the trench isolation regions;

forming trenches in the substrate at the locations; and
forming oxide liners in the trenches of the substrate in a low temperature process;
wherein the low temperature process utilizes SiH$_4$ gas and is performed at a temperature below 700° C.

2. The method of claim 1, wherein the low temperature process is an HDP oxide deposition process without NH$_3$.

3. The method of claim 2, wherein the low temperature process is performed at a temperature below 650° C.

4. The method of claim 1, wherein the low temperature process is a dual frequency RF power PECYD process.

5. The method of claim 4, wherein the low temperature process is performed at a temperature below 550° C.

6. The method of claim 4, further comprising: performing a rapid thermal anneal for approximately 30 seconds at a temperature below 1000° C.

7. A method of manufacturing an integrated circuit having trench isolation regions in a substrate including germanium, the method comprising:
forming a silicon nitride layer above the substrate;
selectively etching the silicon nitride layer to form apertures associated with locations of the trench isolation regions;
forming trenches in the substrate at the locations; and
forming oxide liners in the trenches of the substrate in a low temperature process;
wherein the low temperature process is a UVO process performed at a temperature of less than 600° C.

8. The method of claim 7, wherein the low temperature process is below 550° C.

9. The method of claim 7, wherein the UVO process uses a first UV light with a wavelength of approximately 185 nm.

10. The method of claim 9, further comprising:
emitting a second UV light having a wavelength of approximately 254 nm for further decomposition, after forming the oxide liners.

11. A method of manufacturing an integrated circuit having trench isolation regions in a substrate including germanium, the method comprising:
forming a silicon nitride layer above the substrate;
selectively etching the silicon nitride layer to form apertures associated with locations of the trench isolation regions;
forming trenches in the substrate at the locations; and
forming oxide liners in the trenches of the substrate in a low temperature process;
wherein the low temperature process is an ALD process using SiH$_4$ gas.

12. The method of claim 11, wherein the ALD process uses a pulse cycle process.

13. The method of claim 12, wherein the pulse cycle process alternately turns on and off SiH$_4$ and O$_2$ gas flows.

14. The method of claim 11, wherein the gas flows are turned on in time intervals between approximately 10-30 seconds.

15. A method of forming shallow trench isolation regions in a semiconductor layer comprising germanium, the method comprising:
providing a hard mask layer above the semiconductor layer;
providing a photoresist layer above the hard mask layer;
selectively removing portions of the photoresist layer at locations in a photolithographic process;
removing the hard mask layer at the locations;
forming trenches in the semiconductor layer under the locations; and
forming a liner in the trenches using ultraviolet light in a low temperature process at a temperature below approximately 600° C.

16. The method of claim 15, further comprising providing a pad oxide layer above a strained silicon layer before the providing a hard mask layer step.

17. The method of claim 16, further comprising removing the pad oxide layer at the locations before the step of forming trenches in the hard mask layer under the locations.

18. The method of claim 15, further comprising:
providing an insulative material in the trenches to form the shallow trench isolation regions; and
removing the hard mask layer in a wet bath.

19. The method of claim 18, wherein the wet bath includes acid.

20. The method of claim 15, wherein the low temperature process is below 550° C.

21. A method of forming shallow trench isolation regions in a semiconductor layer, the method comprising:
providing a hard mask layer above the semiconductor layer;
providing a photoresist layer above the hard mask layer;
selectively removing portions of the photoresist layer at locations in a photolithographic process;
removing the hard mask layer at the locations;
forming trenches in the semiconductor layer under the locations; and
forming a liner in the trenches using ultraviolet light;
wherein the forming a liner step is a low temperature process below 700° C.; and
wherein the liner is silicon dioxide grown in an oxygen atmosphere.

22. The method of claim 21, wherein the liner is 200-500 Å thick.

23. The method of claim 21, further comprising providing a pad oxide layer before the providing a hard mask layer step.

24. The method of claim 21, further comprising removing the pad oxide layer at the locations before forming the trenches.

25. The method of claim 21, further comprising providing an insulative material in the trenches to form the trench isolation regions.

* * * * *